United States Patent
Poelma et al.

(10) Patent No.: US 11,292,186 B2
(45) Date of Patent: Apr. 5, 2022

(54) PRODUCTION OF LOW DENSITY PRODUCTS BY ADDITIVE MANUFACTURING

(71) Applicant: Carbon, Inc., Redwood City, CA (US)

(72) Inventors: Justin Poelma, Sunnyvale, CA (US); Jason P. Rolland, San Carlos, CA (US)

(73) Assignee: Carbon, Inc., Redwood City, CA (US)

( * ) Notice: Subject to any disclaimer, the term of this patent is extended or adjusted under 35 U.S.C. 154(b) by 0 days.

(21) Appl. No.: 16/617,042

(22) PCT Filed: Jul. 29, 2019

(86) PCT No.: PCT/US2019/043883
§ 371 (c)(1),
(2) Date: Nov. 26, 2019

(87) PCT Pub. No.: WO2020/028232
PCT Pub. Date: Feb. 6, 2020

(65) Prior Publication Data
US 2021/0023775 A1    Jan. 28, 2021

Related U.S. Application Data

(60) Provisional application No. 62/713,230, filed on Aug. 1, 2018.

(51) Int. Cl.
*B29C 64/124* (2017.01)
*B29C 64/264* (2017.01)
(Continued)

(52) U.S. Cl.
CPC .......... *B29C 64/124* (2017.08); *B29C 64/188* (2017.08); *B29C 64/264* (2017.08);
(Continued)

(58) Field of Classification Search
CPC ............................ B29C 64/124; B29C 64/264
See application file for complete search history.

(56) References Cited

U.S. PATENT DOCUMENTS 3,312,754 A * 4/1967 Marks ..................... C08L 63/00
525/57
3,615,972 A   10/1971 Morehouse, Jr. et al.
(Continued)

FOREIGN PATENT DOCUMENTS

| WO | 2013/151157 | 10/2013 |
| WO | 2017/044381 | 3/2017 |
| WO | 2018/129023 | 7/2018 |

OTHER PUBLICATIONS

Griffini, G., Invernizzi, M., Levi, M., Natale, G., Postiglione, G. and Turri, S., 2016. 3D-printable CFR polymer composites with dual-cure sequential IPNs. Polymer, 91, pp. 174-179. (Year: 2016).*

(Continued)

*Primary Examiner* — Nicholas R Krasnow
(74) *Attorney, Agent, or Firm* — Myers Bigel, P.A.

(57) ABSTRACT

Provided herein according to some embodiments is polymerizable liquid useful for the production of a three-dimensional object by additive manufacturing, said polymerizable liquid comprising a mixture of: (a) at least one photopolymerizable component; (b) a photoinitiator; (c) at least one heat polymerizable component; and (d) heat expandable microspheres. A method of making a three-dimensional object from such a polymerizable liquid by additive manufacturing and objects so produced are also provided.

15 Claims, 4 Drawing Sheets

(51) Int. Cl.
*B29C 64/188* (2017.01)
*B33Y 10/00* (2015.01)
*B33Y 70/00* (2020.01)
*B33Y 80/00* (2015.01)
*B33Y 40/20* (2020.01)
*B29K 7/00* (2006.01)
*B29K 75/00* (2006.01)
*B29L 31/34* (2006.01)
*B29L 31/00* (2006.01)

(52) U.S. Cl.
CPC ...... *B29K 2007/00* (2013.01); *B29K 2049/00* (2013.01); *B29K 2075/02* (2013.01); *B29L 2031/3412* (2013.01); *B29L 2031/721* (2013.01); *B33Y 10/00* (2014.12); *B33Y 40/20* (2020.01); *B33Y 70/00* (2014.12); *B33Y 80/00* (2014.12)

(56) References Cited

U.S. PATENT DOCUMENTS

| | | | | |
|---|---|---|---|---|
| 5,086,088 | A * | 2/1992 | Kitano | C08F 283/10 522/100 |
| 6,833,234 | B1 * | 12/2004 | Bloomstein | B29C 64/40 264/401 |
| 8,388,809 | B2 | 3/2013 | Nordin et al. | |
| 9,062,170 | B2 | 6/2015 | Nordin et al. | |
| 9,205,601 | B2 | 12/2015 | Desimone et al. | |
| 9,211,678 | B2 | 12/2015 | Desimone et al. | |
| 9,216,546 | B2 | 12/2015 | Desimone et al. | |
| 9,453,142 | B2 | 9/2016 | Rolland et al. | |
| 9,598,606 | B2 | 3/2017 | Rolland et al. | |
| 9,676,963 | B2 | 6/2017 | Rolland et al. | |
| 9,902,829 | B2 | 2/2018 | Nordin | |
| 9,968,991 | B2 * | 5/2018 | Arnett | B22C 7/00 |
| 10,023,712 | B2 | 7/2018 | Sakabe et al. | |
| 10,029,550 | B2 | 7/2018 | Richert et al. | |
| 10,030,115 | B2 | 7/2018 | Tayagaki et al. | |
| 2012/0295077 | A1 * | 11/2012 | Ficek | G03F 7/105 428/195.1 |
| 2014/0037873 | A1 * | 2/2014 | Cheung | B64C 1/06 428/34.1 |
| 2016/0114222 | A1 * | 4/2016 | Scolamiero | A63B 37/0031 264/400 |
| 2017/0182561 | A1 * | 6/2017 | Scancarello | B33Y 80/00 |
| 2017/0184086 | A1 * | 6/2017 | Scancarello | F04B 39/02 |
| 2017/0184108 | A1 * | 6/2017 | Scancarello | F04C 29/063 |
| 2017/0260418 | A1 | 9/2017 | Wu et al. | |
| 2018/0095209 | A1 * | 4/2018 | Hakuta | B32B 3/266 |
| 2018/0162054 | A1 * | 6/2018 | Horiuchi | B41M 3/06 |
| 2018/0345575 | A1 * | 12/2018 | Constantinou | B29C 64/165 |
| 2019/0039310 | A1 * | 2/2019 | Busbee | A43B 13/026 |
| 2019/0338106 | A1 * | 11/2019 | Kunc | B29C 64/165 |
| 2020/0023584 | A1 * | 1/2020 | Portela | B29C 64/30 |
| 2020/0109300 | A1 * | 4/2020 | Wu | B29C 64/106 |

OTHER PUBLICATIONS

International Search Report and Written Opinion corresponding to PCT/US2019/043883, dated Oct. 25, 2019 (11 pp).

Tubleston et al "Continuous liquid interface production of 3D objects" Science, 347(6228):1349-1352 (2015).

European Examination Report corresponding to EP 19752355.8; dated Oct. 28, 2021 (6 pages).

* cited by examiner

PRODUCTION OF LOW DENSITY PRODUCTS BY ADDITIVE MANUFACTURING

CROSS REFERENCE TO RELATED APPLICATIONS

This application is a 35 U.S.C. § 371 national phase application of International Application Serial No. PCT/US2019/043883, filed Jul. 29, 2019, which claims the benefit of U.S. provisional patent application Ser. No. 62/713,230, filed on Aug. 1, 2018, the disclosure of which is incorporated by reference herein in its entirety.

FIELD OF THE INVENTION

The present invention concerns resins formulations, and methods of use thereof in additive manufacturing (particularly stereolithography), and objects made from such resins and methods.

BACKGROUND OF THE INVENTION

A group of additive manufacturing techniques sometimes referred to as "stereolithography" create a three-dimensional object by the sequential polymerization of a light polymerizable resin. Such techniques may be "bottom-up" techniques, where light is projected into the resin onto the bottom of the growing object through a light transmissive window, or "top-down" techniques, where light is projected onto the resin on top of the growing object, which is then immersed downward into the pool of resin.

The recent introduction of a more rapid stereolithography technique known as continuous liquid interface production (CLIP), coupled with the introduction of "dual cure" resins for additive manufacturing, has expanded the usefulness of stereolithography from prototyping to manufacturing (see, e.g., U.S. Pat. Nos. 9,211,678; 9,205,601; and 9,216,546 to DeSimone et al.; J. Tumbleston, D. Shirvanyants, N. Ermoshkin et al., Continuous liquid interface production of 3D Objects, Science 347, 1349-1352 (2015); see also Rolland et al., U.S. Pat. Nos. 9,676,963, 9,453,142 and 9,598,606).

SUMMARY OF THE INVENTION

Provided herein according to some embodiments is polymerizable liquid useful for the production of a three-dimensional object by additive manufacturing, said polymerizable liquid comprising a mixture of: (a) at least one photopolymerizable component (e.g., in an amount of from 1 or 5 percent by weight to 90 or 98 percent by weight); (b) a photoinitiator (e.g., in an amount of from 0.05 to 10 percent by weight); (c) at least one heat polymerizable component (e.g., in an amount of from 2 or 5 percent by weight to 90 or 98 percent by weight); and (d) heat expandable microspheres (e.g., in an amount of from 1 or 2 percent by weight, to 5 or 10 percent by weight, or more).

In some embodiments, the photopolymerizable component forms on photopolymerization a scaffold, which scaffold degrades on heating and optionally (but in some embodiments preferably) forms a degradation product that can polymerize with said at least one heat polymerizable component when heated and/or microwave irradiated.

In some embodiments, the heat polymerizable component comprises at least one precursor to a polyurethane, polyurea, or copolymer thereof, a silicone resin, a cyanate ester resin, or a natural rubber.

In some embodiments, the photopolymerizable component forms on photopolymerization a scaffold, which scaffold softens on heating while said heat polymerizable component polymerizes.

In some embodiments, the heat polymerizable component comprises an epoxy resin.

In some embodiments, the microspheres comprise a hollow thermally expandable shell (e.g., a thermoplastic polymer shell), and a propellant (e.g., a low-boiling point liquid or liquified gas such as a lower alkane), contained in said shell.

Also provided is a method of making a three-dimensional object, comprising: (a) producing an intermediate object from a polymerizable liquid as taught herein by additive manufacturing (e.g., by bottom-up stereolithography, such as by continuous liquid interface production); (b) optionally cleaning said object (e.g., by washing, spinning, etc.); and then (c) heating and/or microwave irradiating said object for a time and at a temperature sufficient to expand said microspheres, further cure said object, and form said three-dimensional object.

In some embodiments, the intermediate object comprises a polymer scaffold produced by the photopolymerization of said photopolymerizable component; and wherein said polymer scaffold softens and/or degrades during said heating step, and optionally (but in some embodiments preferably) forms a degradation product that in turn reacts with said at least one heat polymerizable component to form said object.

In some embodiments, the heating and/or microwave irradiating step is carried out under conditions in which the modulus of elasticity of said object decreases during at least a portion of said heating and/or microwave irradiating step.

In some embodiments, the volume of said object is increased by at least 5, 10, or 20 percent by said heating and/or microwave irradiating step.

In some embodiments, the object comprises a regular or irregular open-cell lattice.

In some embodiments, the object comprises a cushion, shock absorber, thermal insulator, or electric insulator.

In some embodiments, the object is rigid, flexible, or elastic.

In some embodiments, the object is comprised of polyurethane, silicone, or epoxy.

Further provided is an object produced by a method or liquid as taught herein.

In some embodiments, the object floats on water at a temperature of 25 degrees Celsius and a pressure of 1 bar.

DETAILED DESCRIPTION OF ILLUSTRATIVE EMBODIMENTS

Figure 1:
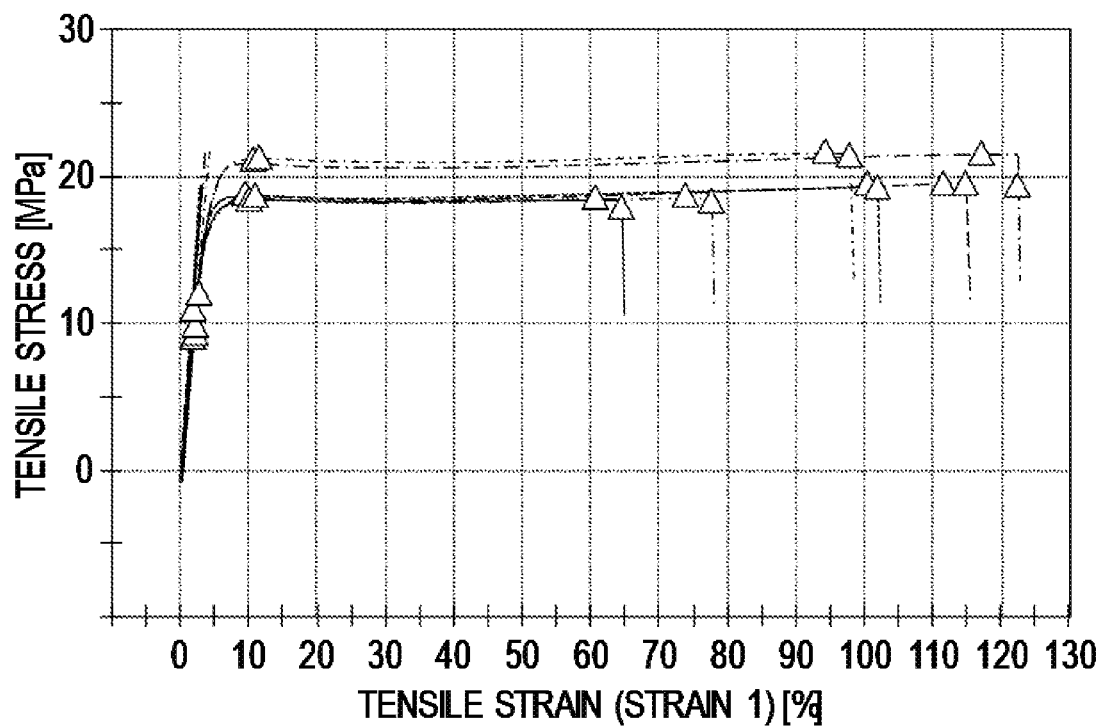
FIG. 1 presents a graph of tensile stress versus strain of specimens produced as described in Examples 1 and 2. The specimens all showed similar, unique yield behaviors, making them highly suitable for applications such as cushions and other impact absorbing materials.

The present invention is now described more fully hereinafter with reference to the accompanying drawings, in which embodiments of the invention are shown. This invention may, however, be embodied in many different forms and should not be construed as limited to the embodiments set forth herein; rather these embodiments are provided so that this disclosure will be thorough and complete and will fully convey the scope of the invention to those skilled in the art.

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises" or "comprising," when used in this specification, specify the presence of stated features, integers, steps, operations, elements components and/or groups or combinations thereof, but do not preclude the presence or addition of one or more other features, integers, steps, operations, elements, components and/or groups or combinations thereof.

As used herein, the term "and/or" includes any and all possible combinations of one or more of the associated listed items, as well as the lack of combinations when interpreted in the alternative ("or").

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and claims and should not be interpreted in an idealized or overly formal sense unless expressly so defined herein. Well-known functions or constructions may not be described in detail for brevity and/or clarity.

1. Polymerizable Liquids (Resins).

Resins. Dual cure additive manufacturing resins are described in, for example, Rolland et al., U.S. Pat. Nos. 9,676,963; 9,598,606; and 9,453,142, and in Wu et al., US Patent Application Pub. No. US2017/0260418, the disclosures of which are incorporated herein by reference. Additional resins are described in, for example, J. Cushin et al., WO 2017/04438, which is also incorporated by reference herein.

Example dual cure resins into which microspheres can be added as described herein include, but are not limited to, Carbon Inc. EPU 40, EPU 41, FPU, RPU 70, SIL 30, and EPX 82 resins, all available from Carbon Inc., 1089 Mills Way, Redwood City, Calif. 94063 USA.

Microspheres. Heat expandable microspheres (sometimes also referred to as "microballoons") are known and described in, for example, U.S. Pat. Nos. 10,030,115 and 10,023,712 (both to Matsumoto), U.S. Pat. Nos. 9,902,829, 9,062,170, and 8,388,809 (all to Akzo Nobel) and U.S. Pat. No. 10,029,550 (to 3M), U.S. Pat. No. 3,615,972 (to Dow), and others. The disclosures of all US Patent references cited herein are incorporated by reference herein in their entirety.

As noted in U.S. Pat. No. 10,029,550, such microspheres expand upon heating and include in particular expandable polymeric microspheres that include a polymer shell and a core material in the form of a gas, liquid or combination thereof that expands upon heating. An expandable microsphere is one where the shell can initially be expanded or further expanded without breaking. Microballoons or microspheres are approximately spherical hollow bodies having an elastic and thermoplastic polymer shell. Accordingly, they are also referred to as expandable polymeric microspheres or as hollow microbeads. Microballoons are filled with low-boiling liquids or with liquefied gas. Shell materials used include more particularly polyacrylonitrile, polyvinyl dichloride (PVDC), polyvinyl chloride (PVC), polyamides or polyacrylates. Suitable low-boiling liquids are, more particularly, hydrocarbons of the lower alkanes, for example isobutane or isopentane, which are enclosed as liquefied gas under pressure in the polymer shell.

Action on the microspheres—more particularly by supply of heat or generation of heat, as for example by ultra-sound or microwave radiation—causes, first, a softening of the outer polymer shell, while at the same time the liquid blowing gas present in the shell undergoes transitions of its gaseous state. At a particular pairing of pressure and temperature the microspheres undergo irreversible expansion and expand three-dimensionally. The expansion ends when the internal pressure equals the external pressure. Since the polymeric shell is maintained, a closed-celled foam is achieved in this way.

A large number of types of microspheres are available commercially, such as, for example, from Akzo Nobel, the EXPANCEL™ DU (dry unexpanded) products, which differ essentially in their size (6 to 45 µm in diameter in the unexpanded state) and in the starting temperature they require for expansion (75 to 220 degrees C.).

Unexpanded types of microballoons are also available in the form of an aqueous dispersion, with a solids fraction or microballoon fraction of around 40% to 45% by weight, and also in the form of polymer-bound microballoons (masterbatches), for example in ethylene-vinyl acetate, with a microballoon concentration of around 65% by weight. Obtainable, furthermore, are what are called microballoon slurry systems, in which the microballoons are present in the form of an aqueous dispersion with a solids fraction of 60% to 80% by weight. The microballoon dispersions, the microballoon slurries, and the masterbatches, like the DU products, can be used in the process described herein.

Additional resin ingredients. The liquid resin or polymerizable material can have (among other things) solid particles suspended or dispersed therein. Any suitable solid particle can be used, depending upon the end product being fabricated. The particles can be metallic, organic/polymeric, inorganic, or composites or mixtures thereof. The particles can be nonconductive, semi-conductive, or conductive (including metallic and non-metallic or polymer conductors); and the particles can be magnetic, ferromagnetic, paramagnetic, or nonmagnetic. The particles can be of any suitable shape, including spherical, elliptical, cylindrical, etc. The particles can be of any suitable size (for example, ranging from 1 nm to 20 µm average diameter).

The particles can comprise an active agent or detectable compound as described below, though these may also be provided dissolved or solubilized in the liquid resin as also discussed below. For example, magnetic or paramagnetic particles or nanoparticles can be employed.

The liquid resin can have additional ingredients solubilized therein, including pigments, dyes, diluents, active compounds or pharmaceutical compounds, detectable compounds (e.g., fluorescent, phosphorescent, radioactive), etc., again depending upon the particular purpose of the product being fabricated. Examples of such additional ingredients include, but are not limited to, proteins, peptides, nucleic acids (DNA, RNA) such as siRNA, sugars, small organic compounds (drugs and drug-like compounds), etc., including combinations thereof.

Dyes/non-reactive light absorbers. In some embodiments, polymerizable liquids for carrying out the present invention include a non-reactive pigment or dye that absorbs light, particularly UV light. Suitable examples of such light absorbers include, but are not limited to: (i) titanium dioxide (e.g., included in an amount of from 0.05 or 0.1 to 1 or 5 percent by weight), (ii) carbon black (e.g., included in an amount of from 0.05 or 0.1 to 1 or 5 percent by weight), and/or (iii) an organic ultraviolet light absorber such as a hydroxybenzophenone, hydroxyphenylbenzotriazole, oxanilide, benzophenone, thioxanthone, hydroxyphenyltriazine, and/or benzotriazole ultraviolet light absorber (e.g., Mayzo BLS® 1326) (e.g., included in an amount of 0.001 or 0.005 to 1, 2 or 4 percent by weight). Examples of suitable organic ultraviolet light absorbers include, but are not limited to, those described in U.S. Pat. Nos. 3,213,058; 6,916,867; 7,157,586; and 7,695,643, the disclosures of which are incorporated herein by reference.

Fillers. Any suitable filler may be used in connection with the present invention, depending on the properties desired in the part or object to be made. Thus, fillers may be solid or liquid, organic or inorganic, and may include reactive and non-reactive rubbers: siloxanes, acrylonitrile-butadiene rubbers; reactive and non-reactive thermoplastics (including but not limited to: poly(ether imides), maleimide-styrene terpolymers, polyarylates, polysulfones and polyethersulfones, etc.) inorganic fillers such as silicates (such as talc, clays, silica, mica), glass, carbon nanotubes, graphene, cellulose nanocrystals, etc., including combinations of all of the foregoing. Suitable fillers include tougheners, such as core-shell rubbers, as discussed below.

Tougheners. One or more polymeric and/or inorganic tougheners can be used as a filler in the present invention. The toughener may be uniformly distributed in the form of particles in the cured product. The particles could be less than 5 microns (μm) in diameter. Such tougheners include, but are not limited to, those formed from elastomers, branched polymers, hyperbranched polymers, dendrimers, rubbery polymers, rubbery copolymers, block copolymers, core-shell particles, oxides or inorganic materials such as clay, polyhedral oligomeric silsesquioxanes (POSS), carbonaceous materials (e.g., carbon black, carbon nanotubes, carbon nanofibers, fullerenes), ceramics and silicon carbides, with or without surface modification or functionalization.

Core-shell rubbers. Core-shell rubbers are particulate materials (particles) having a rubbery core. Such materials are known and described in, for example, US Patent Application Publication No. 20150184039, as well as US Patent Application Publication No. 20150240113, and U.S. Pat. Nos. 6,861,475, 7,625,977, 7,642,316, 8,088,245, and elsewhere. In some embodiments, the core-shell rubber particles are nanoparticles (i.e., having an average particle size of less than 1000 nanometers (nm)). Generally, the average particle size of the core-shell rubber nanoparticles is less than 500 nm, e.g., less than 300 nm, less than 200 nm, less than 100 nm, or even less than 50 nm. Typically, such particles are spherical, so the particle size is the diameter; however, if the particles are not spherical, the particle size is defined as the longest dimension of the particle. Suitable core-shell rubbers include, but are not limited to, those sold by Kaneka Corporation under the designation Kaneka Kane Ace, including the Kaneka Kane Ace 15 and 120 series of products, including Kaneka Kane Ace MX 120, Kaneka Kane Ace MX 153, Kaneka Kane Ace MX 154, Kaneka Kane Ace MX 156, Kaneka Kane Ace MX170, Kaneka Kane Ace MX 257, and Kaneka Kane Ace MX 120 core-shell rubber dispersions, and mixtures thereof.

Organic diluents. In some embodiments, diluents for use in the present invention are preferably reactive organic diluents; that is, diluents that will degrade, isomerize, cross-react, or polymerize, with themselves or a light polymerizable component, during the additive manufacturing step. In general, the diluent(s) are included in an amount sufficient to reduce the viscosity of the polymerizable liquid or resin (e.g., to not more than 15,000, 10,000, 6,000, 5,000, 4,000, or 3,000 centipoise at 25 degrees Centigrade). Suitable examples of diluents include, but are not limited to, N,N-dimethylacrylamide, N-vinyl-2-pyrrolidone, and N-vinyl formamide, or a mixture if two or more thereof. The diluent may be included in the polymerizable liquid in any suitable amount, typically from 1, 5 or 10 percent by weight, up to about 30 or 40 percent by weight, or more.

Accelerators. In some embodiments, the liquid may include a deoxygenating compound as an accelerator of stereolithography (particularly CLIP). An example of a suitable such accelerator is triphenylphosphine.

2. Production by Additive Manufacturing.

Polymerizable liquids or resins as described herein may be used to make three-dimensional objects, in a "light" cure (typically by additive manufacturing) which in some embodiments generates a "green" intermediate object, followed in some embodiments by a second (typically heat) cure of that intermediate object.

Techniques for additive manufacturing are known. Suitable techniques include bottom-up or top-down additive manufacturing, generally known as stereolithography. Such methods are known and described in, for example, U.S. Pat. No. 5,236,637 to Hull, U.S. Pat. Nos. 5,391,072 and 5,529,473 to Lawton, U.S. Pat. No. 7,438,846 to John, U.S. Pat. No. 7,892,474 to Shkolnik, U.S. Pat. No. 8,110,135 to El-Siblani, U.S. Patent Application Publication No. 2013/0292862 to Joyce, and US Patent Application Publication No. 2013/0295212 to Chen et al. The disclosures of these patents and applications are incorporated by reference herein in their entirety.

In some embodiments, the intermediate object is formed by continuous liquid interface production (CLIP). CLIP is known and described in, for example, U.S. Pat. Nos. 9,211,678, 9,205,601, 9,216,546, and in J. Tumbleston, D. Shirvanyants, N. Ermoshkin et al., Continuous liquid interface production of 3D Objects, *Science* 347, 1349-1352 (2015). See also R. Janusziewcz et al., Layerless fabrication with continuous liquid interface production, *Proc. Natl. Acad. Sci. USA* 113, 11703-11708 (2016). In some embodiments, CLIP employs features of a bottom-up three-dimensional fabrication as described above, but the irradiating and/or said advancing steps are carried out while also concurrently maintaining a stable or persistent liquid interface between the growing object and the build surface or window, such as by: (i) continuously maintaining a dead zone of polymerizable liquid in contact with said build surface, and (ii) continuously maintaining a gradient of polymerization zone (such as an active surface) between the dead zone and the solid polymer and in contact with each thereof, the gradient of polymerization zone comprising the first component in partially-cured form. In some embodiments of CLIP, the optically transparent member comprises a semipermeable member (e.g., a fluoropolymer), and the continuously maintaining a dead zone is carried out by feeding an inhibitor of polymerization through the optically transparent member, thereby creating a gradient of inhibitor in the dead zone and optionally in at least a portion of the gradient of polymerization zone. Other approaches for carrying out CLIP that can be used in the present invention and potentially obviate the need for a semipermeable "window" or window structure include utilizing a liquid interface comprising an immiscible liquid (see L. Robeson et al., WO 2015/164234), generating oxygen as an inhibitor by electrolysis (see I. Craven et al., WO 2016/133759), and incorporating magnetically positionable particles to which the photoactivator is coupled into the polymerizable liquid (see J. Rolland, WO 2016/145182).

Other examples of methods and apparatus for carrying out particular embodiments of CLIP include, but are not limited to: Batchelder et al., US Patent Application Pub. No. US 2017/0129169; Sun and Lichkus, US Patent Application Pub. No. US 2016/0288376; Willis et al., US Patent Application Pub. No. US 2015/0360419; Lin et al., US Patent Application Pub. No. US 2015/0331402; D. Castanon, US Patent Application Pub. No. US 2017/0129167; B. Feller, US Pat App. Pub. No. US 2018/0243976; M. Panzer and J. Tumbleston, US Pat App Pub. No. US 2018/0126630 (published May 10, 2018); and K. Willis and B. Adzima, US Pat App Pub. No. US 2018/0290374 (Oct. 11, 2018).

After an intermediate three-dimensional object is formed, it is optionally cleaned, optionally dried (e.g., air dried) and/or rinsed (in any sequence). It is then further cured, preferably by heating (although further curing may in some embodiments be concurrent with the first cure, or may be by different mechanisms such as contacting to water, as described in U.S. Pat. No. 9,453,142 to Rolland et al.).

3. Cleaning or Washing.

Objects as described above can be cleaned in any suitable apparatus, in some embodiments with a wash liquid as described herein, and in other embodiments by wiping (with an absorbent, air blade, etc.) spinning, or variations thereof.

Wash liquids that may be used to carry out the present invention include, but are not limited to, water, organic solvents, and combinations thereof (e.g., combined as cosolvents), optionally containing additional ingredients such as surfactants, chelants (ligands), enzymes, borax, dyes or colorants, fragrances, etc., including combinations thereof. The wash liquid may be in any suitable form, such as a solution, emulsion, dispersion, etc.

In some preferred embodiments, where the residual resin has a boiling point of at least 90 or 100° C. (e.g., up to 250 or 300° C., or more), the wash liquid has a boiling point of at least 30° C., but not more than 80 or 90° C. Boiling points are given herein for a pressure of 1 bar or 1 atmosphere.

In some embodiments, the wash liquid consists of a 50:50 (volume:volume) solution of water and an alcohol organic solvent such as isopropanol (2-propanol).

Examples of hydrofluorocarbon solvents that may be used to carry out the present invention include, but are not limited to, 1,1,1,2,3,4,4,5,5,5-decafluoropentane (Vertrel® XF, DuPont™ Chemours), 1,1,1,3,3-Pentalluoropropane, 1,1,1,3,3-Pentafluorobutane, etc.

Examples of hydrochlorofluorocarbon solvents that may be used to carry out the present invention include, but are not limited to, 3,3-Dichloro-1,1,1,2,2-pentafluoropropane, 1,3-Dichloro-1,1,2,2,3-pentafluoropropane, 1,1-Dichloro-1-fluoroethane, etc., including mixtures thereof.

Examples of hydrofluoroether solvents that may be used to carry out the present invention include, but are not limited to, methyl nonafluorobutyl ether (HFE-7100), methyl nonafluoroisobutyl ether (HFE-7100), ethyl nonafluorobutyl ether (HFE-7200), ethyl nonafluoroisobutyl ether (HFE-7200), 1,1,2,2-tetrafluoroethyl-2,2,2-trifluoroethyl ether, etc., including mixtures thereof. Commercially available examples of this solvent include Novec 7100 (3M), Novec 7200 (3M).

Examples of volatile methylsiloxane solvents that may be used to carry out the present invention include, but are not limited to, hexamethyldisiloxane (OS-10, Dow Corning), octamethyltrisiloxane (OS-20, Dow Corning), decamethyltetrasiloxane (OS-30, Dow Corning), etc., including mixtures thereof.

Other siloxane solvents (e.g., NAVSOLVE™ solvent) that may be used to carry out the present invention include but are not limited to those set forth in U.S. Pat. No. 7,897,558.

In some embodiments, the wash liquid comprises an azeotropic mixture comprising, consisting of, or consisting essentially of a first organic solvent (e.g., a hydrofluorocarbon solvent, a hydrochlorofluorocarbon solvent, a hydrofluoroether solvent, a methylsiloxane solvent, or a combination thereof; e.g., in an amount of from 80 or 85 to 99 percent by weight) and a second organic solvent (e.g., a C1-C4 or C6 alcohol such as methanol, ethanol, isopropanol, tert-butanol, etc.; e.g., in an amount of from 1 to 15 or 20 percent by weight). Additional ingredients such as surfactants or chelants may optionally be included. In some embodiments, the azeotropic wash liquid may provide superior cleaning properties, and/or enhanced recyclability, of the wash liquid. Additional examples of suitable azeotropic wash liquids include, but are not limited to, those set forth in U.S. Pat. Nos. 6,008,179; 6,426,327; 6,753,304; 6,288,018; 6,646,020; 6,699,829; 5,824,634; 5,196,137; 6,689,734; and 5,773,403, the disclosures of which are incorporated by reference herein in their entirety.

When the wash liquid includes ingredients that are not desired for carrying into the further curing step, in some embodiments the initial wash with the wash liquid can be followed with a further rinsing step with a rinse liquid, such as water (e.g., distilled and/or deionized water), or a mixture of water and an alcohol such as isopropanol.

4. Further Curing.

After washing, the object is in some embodiments further cured, preferably by heating or baking.

Heating may be active heating (e.g., in an oven, such as an electric, gas, solar oven or microwave oven, heated bath, or combination thereof), or passive heating (e.g., at ambient (room) temperature). Active heating will generally be more rapid than passive heating and in some embodiments is preferred, but passive heating—such as simply maintaining the intermediate at ambient temperature for a sufficient time to effect further cure—is in some embodiments preferred.

In some embodiments, the heating step is carried out at at least a first (oven) temperature and a second (oven) temperature, with the first temperature greater than ambient temperature, the second temperature greater than the first temperature, and the second temperature less than 300° C. (e.g., with ramped or step-wise increases between ambient temperature and the first temperature, and/or between the first temperature and the second temperature).

For example, the intermediate may be heated in a stepwise manner at a first temperature of about 70° C. to about 150° C., and then at a second temperature of about 150° C. to 200 or 250° C., with the duration of each heating depending on the size, shape, and/or thickness of the intermediate. In another embodiment, the intermediate may be cured by a ramped heating schedule, with the temperature ramped from ambient temperature through a temperature of 70 to 150° C., and up to a final (oven) temperature of 250 or 300° C., at a change in heating rate of 0.5° C. per minute, to 5° C. per minute. (See, e.g., U.S. Pat. No. 4,785,075).

In some embodiments, the heating step is carried out in an inert gas atmosphere. Inert atmosphere ovens are known, and generally employ an atmosphere enriched in nitrogen, argon, or carbon dioxide in the oven chamber. Suitable examples include but are not limited to those available from Grieve Corporation, 500 Hart Road Round Lake, Ill. 60073-2898 USA, Davron Technologies, 4563 Pinnacle Lane, Chattanooga, Tenn. 37415 USA, Despatch Thermal Processing Technology, 8860 207th Street, Minneapolis, Minn. 55044 USA, and others.

In other embodiments, the heating step is carried out in an inert liquid bath. Suitable inert liquids may be aqueous liquids (i.e., pure water, salt solutions, etc.), organic liquids (e.g., mineral oil, fluorinated, perfluorinated, and polysiloxane organic compounds such as perfluorohexane, perfluoro(2-butyl-tetrahydrofurane), perfluorotripentylamine, etc. (commercially available as PERFLUORINERT® inert liquids from 3M Company)), and mixtures thereof. These inert liquids can be deoxygenated if necessary, such as by bubbling an inert gas such as nitrogen through the liquid, by boiling the inert liquid, by mixing oxygen-scavenging agents with the inert liquid medium (or contacting them to one another), etc., including combinations thereof (see, e.g., U.S. Pat. No. 5,506,007).

In some embodiments, the further curing or heating step (whether carried out in a liquid or gas fluid) is carried out at an elevated pressure (e.g., elevated sufficiently to reduce volatilization or out-gassing of residual monomers, prepolymers, chain extenders, and/or reactive diluents, etc.). Suitable pressure ranges are from 10 or 15 psi to 70 or 100 psi, or more.

5. Objects Made.

The present invention can be implemented for the production of any object by additive manufacturing.

In some embodiments, where the objects are made from a resin prone to shrinking, the microballoons can be added to offset shrinking that may otherwise occur.

In other embodiments, the objects can be additively produced at a smaller size than intended (e.g., to speed the additive manufacturing step), and then expanded to the intended final size during the further curing step.

In some embodiments, the resins of the invention may be used to produce heat insulators and heat insulating objects.

In some embodiments, the resins are useful for the production of low-k dielectric objects or electrical insulators, such as for use as packaging in the semiconductor industry.

In some embodiments, after the further curing step, the object made is dipped or immersed in a liquid such as a penetrant liquid, so that the pores may fill with another material such as a dye.

In some embodiments, prior to the further curing step, the intermediate object is contacted (e.g., in a fixturing apparatus) to another pre-formed object, and the further curing step carried out with the intermediate object contacting the pre-formed object, to produce a composite object. The expansion of the intermediate object by the microballoons may aid in joining the two objects together.

The resins of the present invention are useful for making objects that comprise lattices, including rigid lattices where no recovery after impact is necessary (e.g., impact absorbers such as in automotive bumpers and body panels, helmets and helmet inserts such as in bicycling and motorcycling helmets which are typically discarded after a single impact, etc.). In some embodiments, the use of the microballoons in the resins as taught herein may increase the stiffness of lattices compared to non-expanded lattices with approximately the same mass and overall dimensions.

As products made from resins of the present invention may have a fine textured or "sand paper" feel, they can be used to produce objects that have a matte finish, and/or to produce an object having an antislip or gripping surface.

The foregoing is illustrated in greater detail in the following non-limiting Examples.

EXAMPLE 1

Loading of a Flexible Polyurethane Dual Cure Resin with Microspheres and Production of "Green" Intermediate Object Dual-cure resin additive manufacturing resin FPU 50, commercially available from Carbon, Inc., 1089 Mills Way, Redwod City, Calif. 94063 USA, FPU 50, was dispensed into a mixing cup according to standard operating procedures. EXPANCEL™ DU microspheres (461 DU 40) were then added to the Part A+B resin mixture to obtain a total loading of 3 wt %. The DU particles were dispersed with a 4-propeller mixing blade for 5 minutes at 250-300 rpm. The material was then 3d-printed with Carbon's DLS/CLIP technology to obtain a 3d part.

EXAMPLE 2

Further Curing of Green Intermediate Object and Expansion of Microspheres

The "green" object produced in Example 1 was thermally cured in an oven at 120 degrees Centigrade for 12 h according to the FPU 50 operating procedure. During this baking step, the expanding microspheres are activated causing a decrease in part density and volume expansion. The final parts have a density of about 0.8 g/cc and volume expansion 20-25%—A substantial change from the same resin without the microspheres (density of about 1.05 g/cc).

TABLE 1

Flexible polyurethane resin with 3 wt % microspheres and product properties

| | Parts by weight |
|---|---|
| FPU 50 | 97 |
| 461 DU 40 | 3 |
| Tensile Strength (MPa) | 20 |
| Tensile Modulus (MPa) | 620 |

EXAMPLE 3

Tensile Properties

Six expanded tensile specimens were produced in like manner as described in Examples 1-2 above and their stress-strain properties determined in accordance with standard techniques. As shown in FIG. 1, the specimens all showed similar, unique yield behaviors, making them highly suitable for applications such as cushions and other impact absorbing materials.

EXAMPLE 4

Failure of Expansion of Microspheres in Product Produced with a Single Cure Resin A conventional single-cure (light cured) urethane methacrylate resin, UMA 90, available from Carbon Inc., was loaded with microspheres in like manner as in Example 1, products produced in like manner, and the products heated in like manner. The microspheres, however, did not expand, and the resulting product did not show a decrease in density. Without wishing to be bound to any specific theory of the invention, we hypothesize that the highly crosslinked network typical of single-cure photopolymer resins, that cannot rearrange or undergo secondary chemistry, prevents the expansion of the particles.

EXAMPLE 5

Loading of an Elastic Polyurethane Dual Cure Resin with Microspheres

In this Example, the microspheres were added to Carbon Inc. elastic polyurethane dual cure resin EPU 41, a part produced, and the part baked, according to the procedure described in Example 1 above. Results are given in Table 2 below.

TABLE 2

| Elastic polyurethane resin with with 3 wt % microspheres and product properties. | |
|---|---|
| | Parts by weight |
| EPU 41 | 97 |
| 461 DU 40 | 3 |
| Density | 0.82 g/cc |
| Volumetric Expansion | 23% |

EXAMPLE 6

Loading of an Epoxy Dual Cure Resin with Microspheres and Production of Object This example is carried out in like manner as Examples 1-2 above, except that an epoxy dual cure resin, EPX 82, commercially available from Carbon Inc., is used instead of FPU 50, and additive production and further curing is carried out in accordance with standard techniques for the EPX 82 resin.

While objects made from the EPX 82 resin do not have a rearrangable polymer network like that provided by the FPU and RPU resins, Dynamic Mechanical Analysis (DMA) reveals that the "green" part is still affected by temperature, with the modulus dropping to approximately the same range as that of the FPU and RPU resins, thereby indicating that the microballoons can expand during the heat curing step.

Initial experiments with the microballoons in EPX 82 resin did not produce visible expansion. However, altering conditions such as the heating temperature range and time may result in sufficient softening to allow the microballoon expansion of the produced part considering the drop in modulus noted above upon heating.

EXAMPLE 7

Production of Lattice Objects

Figure 2:
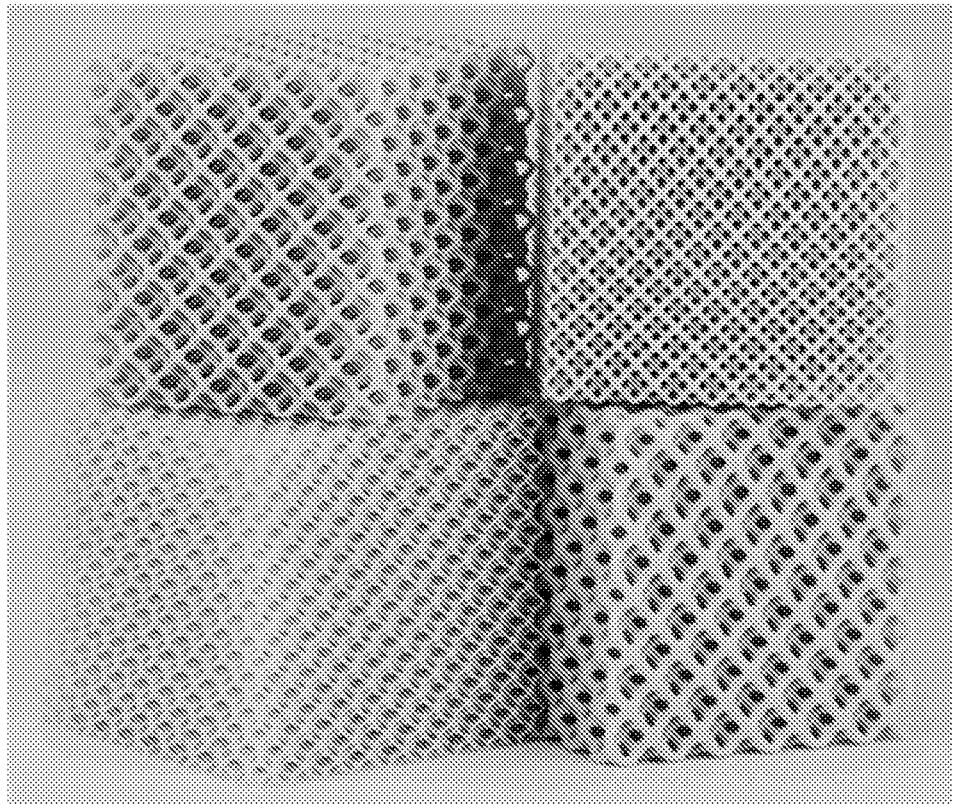
FIG. 2 is a photograph showing four lattice structures produced by stereolithography and subsequent heat cure with a dual cure resin.
Figure 3:
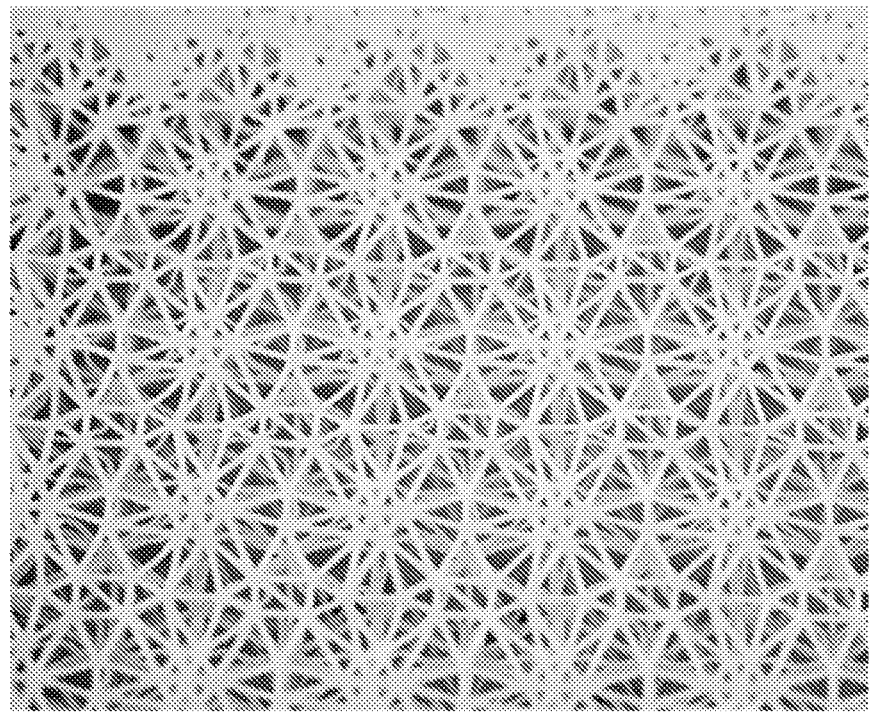
FIG. 3 is a photograph showing a lattice structure produced by stereolithography and subsequent heat cure with a dual cure resin.

Dual cure resins as described above are useful for the production of objects comprised of lattices, such as lattices shown in FIG. 2 and FIG. 3.

While lattices shown in FIG. 2 and FIG. 3 are formed by stereolithography and subsequent heat cure from resins that do not contain thermally expandable microspheres, expanded versions of the lattices are produced by including microspheres as described herein, and then forming the lattice objects by stereolithography, and subsequent heat curing, in accordance with known techniques.

Figure 4:
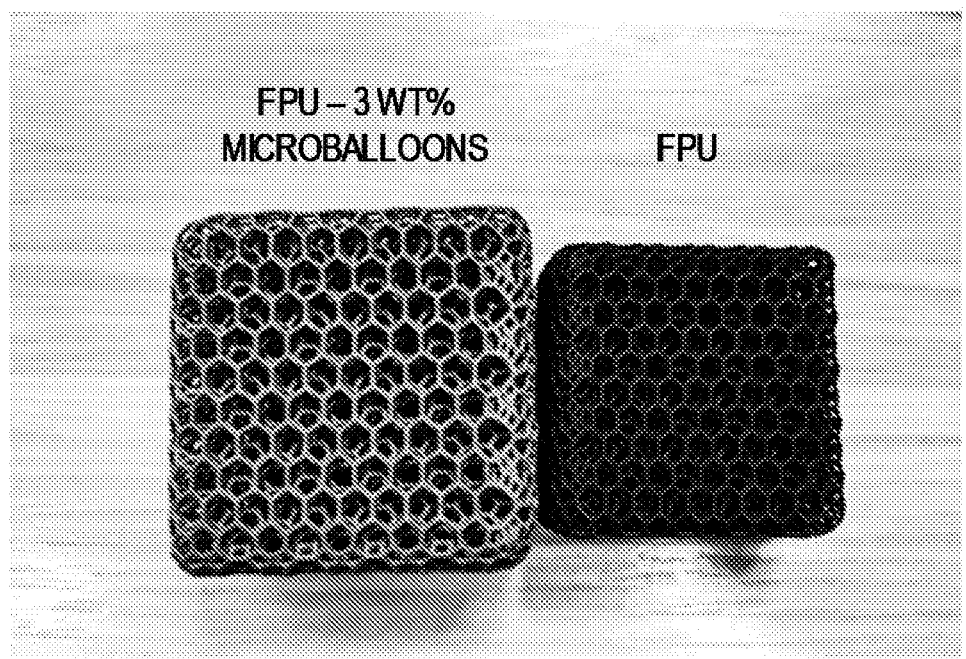
FIG. 4 is a photograph showing lattice structures produced by stereolighography and subsequent heat cure of the dual cure resin FPU with and without 3 wt % of microballoons. There was 20% bulk expansion (printed cube), and 23% expansion of lattice dimensions.
Figure 5A:
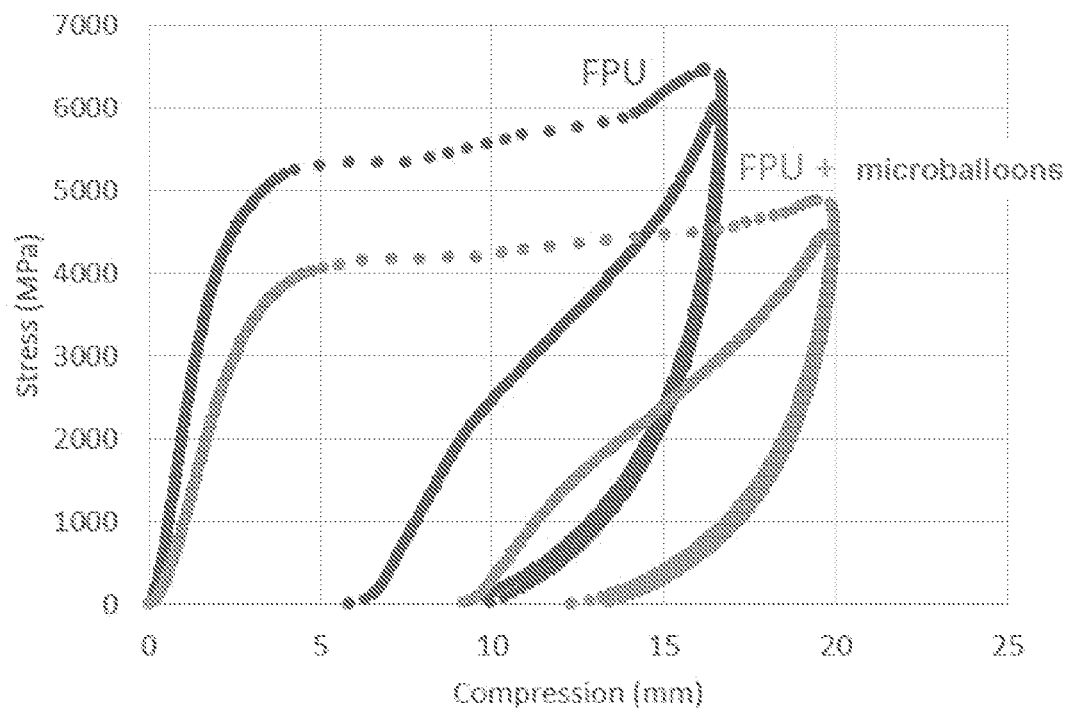
FIG. 5A-FIG. 5D present graphs showing a comparison of expanded versus non-expanded lattice performance in FPU and EPU41 resins.
Figure 5B:
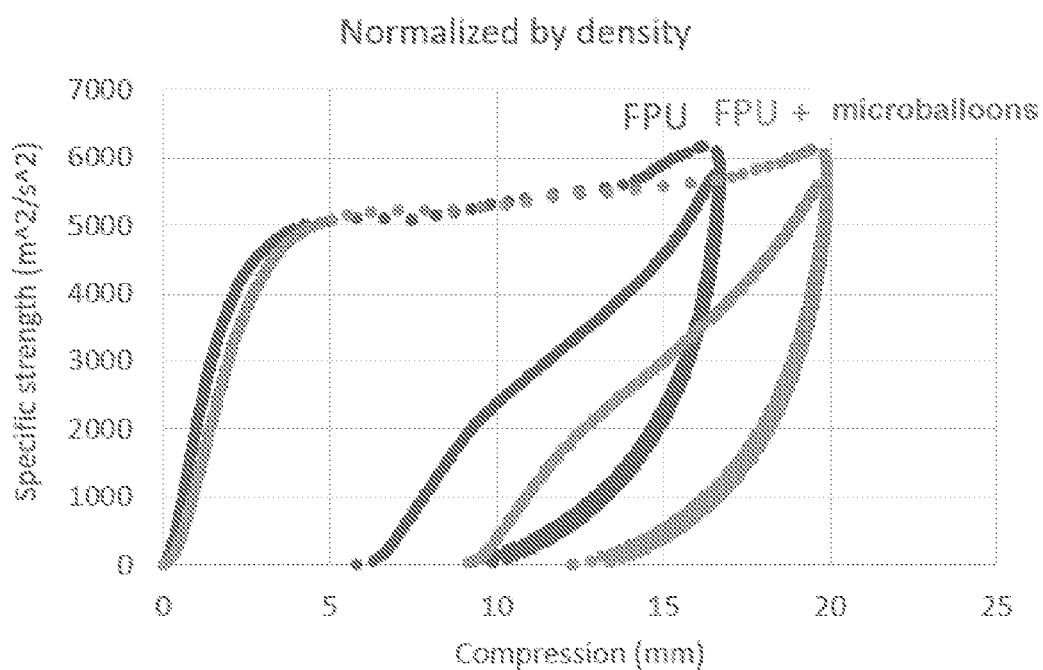
Figure 5C:
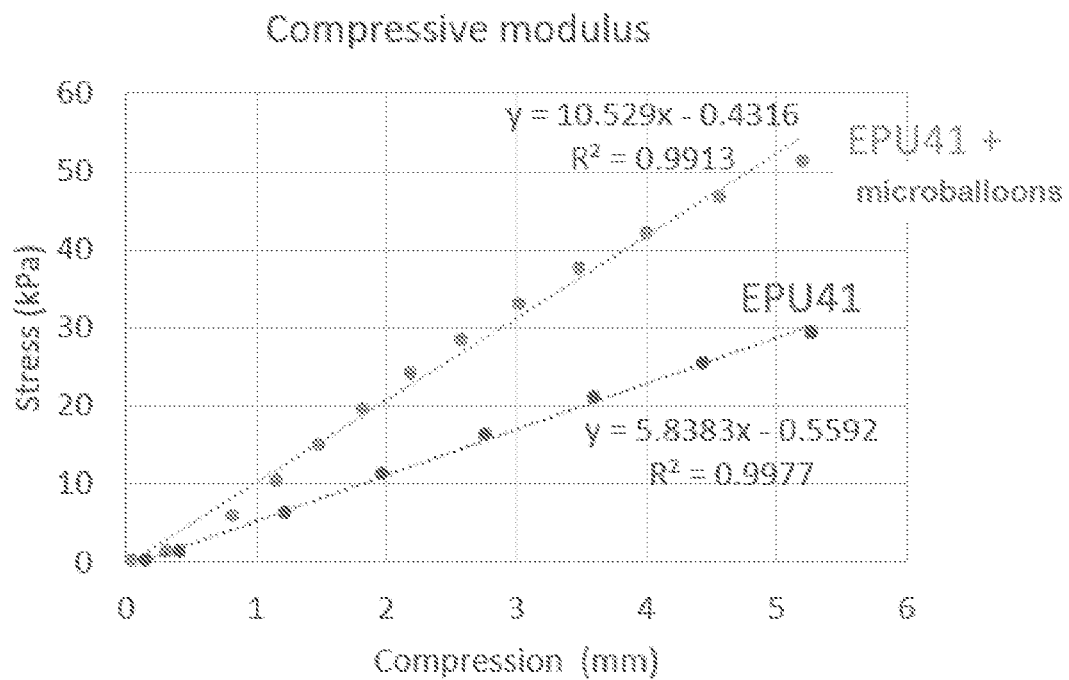
Figure 5D:
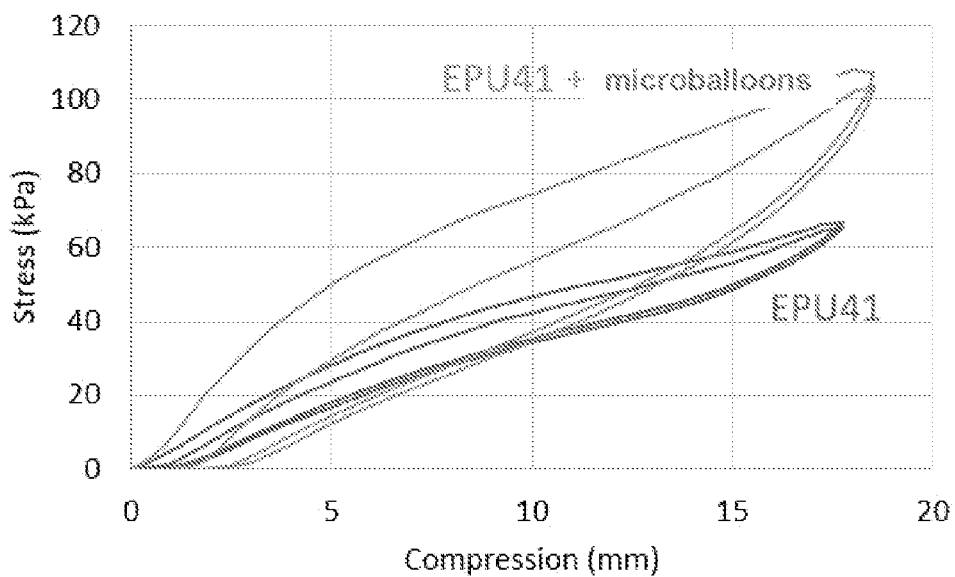

For example, the image in FIG. 4 shows FPU with and without 3 wt % of microballoons. Samples were baked according to the FPU curing schedule—12 h, 120° C. There was 20% bulk expansion (printed cube), and 23% expansion of lattice dimensions.

As shown in the graphs of FIG. 5A-5D, the addition of the microballoons generally increases the stiffness of lattices compared to non-expanded lattices with approximately the same mass and overall dimensions. This effect may be attributed to the increase in node size and strut diameter as the microballoons expand during baking. These properties may be particularly advantageous in applications where high-stiffness, low-weight lattices are preferred (e.g. foam replacements, midsoles, helmets, seat cushioning).

The foregoing is illustrative of the present invention, and is not to be construed as limiting thereof. The invention is defined by the following claims, with equivalents of the claims to be included therein.

We claim:

1. A method of making a three-dimensional object, comprising:
   (a) producing an intermediate object from a polymerizable liquid by additive manufacturing, said polymerizable liquid comprising a mixture of:
      (i) at least one photopolymerizable component,
      (ii) a photoinitiator,
      (iii) at least one heat polymerizable component, and
      (iv) heat expandable microspheres;
   (b) optionally cleaning said intermediate object; and then
   (c) heating and/or microwave irradiating said intermediate object for a time and at a temperature sufficient to expand said microspheres, further cure said intermediate object, and form said three-dimensional object,
   wherein said intermediate object comprises a polymer scaffold produced by the photopolymerization of said photopolymerizable component; and wherein said polymer scaffold degrades during said heating step, and forms a degradation product that in turn reacts with said at least one heat polymerizable component to form said three-dimensional object.

2. The method of claim 1, wherein said heating and/or microwave irradiating step is carried out under conditions in which the modulus of elasticity of said intermediate object decreases during at least a portion of said heating and/or microwave irradiating step.

3. The method of claim 1, wherein said three-dimensional object is rigid, flexible, or elastic.

4. The method of claim 1, wherein said three-dimensional object is comprised of polyurethane, silicone, or epoxy.

5. The method of claim 1, wherein said heat polymerizable component comprises at least one precursor to a polyurethane, polyurea, or copolymer thereof, a silicone resin, a cyanate ester resin, or a natural rubber.

6. The method of claim 1, wherein said intermediate object comprises a polymer scaffold produced by the photopolymerization of said photopolymerizable component; and wherein said polymer scaffold softens during said heating step.

7. The method of claim 6, wherein said heat polymerizable component comprises an epoxy resin.

8. The method of claim 1, wherein said microspheres comprise a hollow thermally expandable shell and a propellant contained in said shell.

9. The method of claim 1, wherein said producing step is carried out by bottom-up stereolithography.

10. The method of claim 1, wherein said producing step is carried out by continuous liquid interface production.

11. The method of claim 1, wherein said heat expandable microspheres are present in an amount of from 1 percent by weight to 10 percent by weight.

12. The method of claim 1, wherein the volume of said intermediate object is increased by at least 5 percent by said heating and/or microwave irradiating step.

13. The method of claim 1, wherein said three-dimensional object comprises a regular or irregular open-cell lattice.

14. The method of claim 1, wherein said three-dimensional object comprises a cushion, shock absorber, thermal insulator, or electric insulator.

15. The method of claim 1, wherein said heat polymerizable component comprises at least one precursor to a polyurethane, polyurea, or copolymer thereof.

* * * * *